United States Patent
Fukunaga et al.

[11] Patent Number: 5,601,228
[45] Date of Patent: Feb. 11, 1997

[54] SOLDER-PRECIPITATING COMPOSITION AND MOUNTING METHOD USING THE COMPOSITION

[75] Inventors: Takao Fukunaga, Yokohama; Kazuhito Higasa; Hirokazu Shiroishi, both of Hiratsuka; Seishi Kumamoto, Aichi-ken; Takahiro Fujiwara, Hiratsuka; Noriko Katayama, Akashi, all of Japan

[73] Assignees: The Furukawa Electric Co., Ltd., Tokyo; Harima Chemicals, Inc., Kakogawa, both of Japan

[21] Appl. No.: 501,085

[22] PCT Filed: Dec. 6, 1994

[86] PCT No.: PCT/JP94/02047

§ 371 Date: Aug. 2, 1995

§ 102(e) Date: Aug. 2, 1995

[87] PCT Pub. No.: WO95/15834

PCT Pub. Date: Jun. 15, 1995

[30] Foreign Application Priority Data

Dec. 6, 1993 [JP] Japan ..................................... 5-340024

[51] Int. Cl.⁶ .............................. H05K 3/34; B23K 35/34
[52] U.S. Cl. .................... 228/180.21; 228/209; 228/253; 148/24; 437/183
[58] Field of Search ............................ 228/180.21, 248.1, 228/253, 254, 209; 148/23, 24; 427/123; 437/183

[56] References Cited

U.S. PATENT DOCUMENTS

| | | | |
|---|---|---|---|
| 4,896,817 | 1/1990 | Snyder et al. | 228/123 |
| 5,145,532 | 9/1992 | Fukunaga et al. | 148/23 |
| 5,188,029 | 6/1992 | Fuse et al. | 228/198 |
| 5,296,649 | 3/1994 | Kosuga et al. | 228/180.1 |
| 5,453,582 | 9/1995 | Amano et al. | 174/261 |

FOREIGN PATENT DOCUMENTS

| | | |
|---|---|---|
| 2-56197 | 11/1990 | Japan. |
| 2-310991 | 12/1990 | Japan. |
| 4-300088 | 10/1992 | Japan. |

*Primary Examiner*—Samuel M. Heinrich
*Attorney, Agent, or Firm*—Frishauf, Holtz, Goodman, Langer & Chick, P.C.

[57] ABSTRACT

The invention provides a solder-precipitating composition containing Sn-Pb alloy powder and an organic acid salt of Pb as essential components, and capable of precipitating solder as a result of substitution between Sn contained in the Sn-Pb alloy powder and Pb contained in the organic acid salt of Pb. Further, the invention provides a mounting method including the steps of supplying a conductor on a board with a solder-precipitating composition which contains Sn-Pb alloy powder and an organic acid salt of Pb as essential components, heating the solder-precipitating composition supplied on the conductor, to precipitate solder on the conductor and pre-coat the conductor with solder, as a result of substitution reaction between Sn in the Sn-Pb alloy powder and Pb ions in the organic acid salt of Pb, mounting a device on the solder pre-coated conductor, and melting the solder layer to securely mount the device on the conductor.

9 Claims, 1 Drawing Sheet

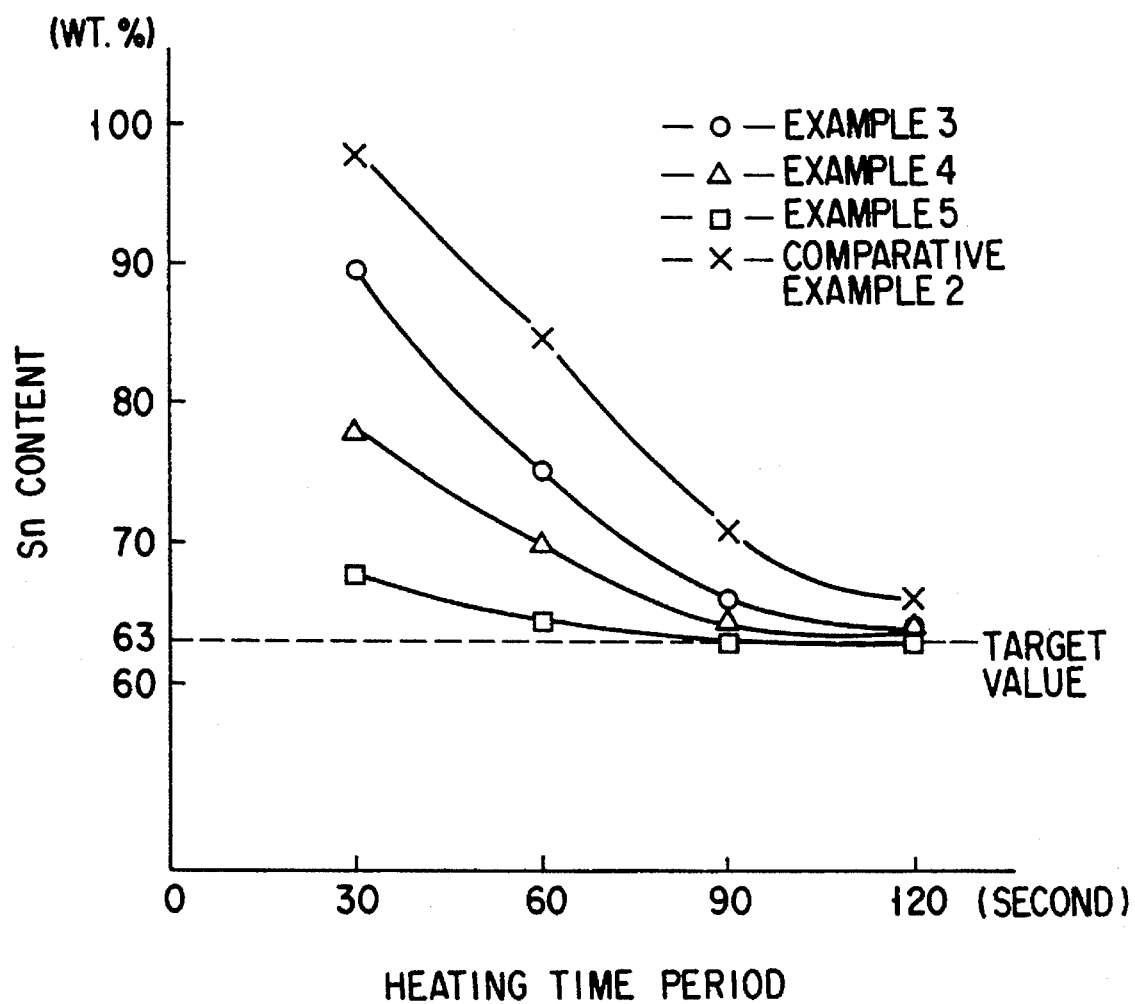

SOLDER-PRECIPITATING COMPOSITION AND MOUNTING METHOD USING THE COMPOSITION

TECHNICAL FIELD

This invention relates to a solder-precipitating composition and a mounting method using the composition, and more particularly to a composition and a mounting method using the composition, which are capable of forming, in a relatively short time, an uniform and relatively-thick solder layer on each of conductive portions (pads) of a circuit board, and pre-coating solder without creating a solder bridge even when the distance between the conductive portions is narrow.

BACKGROUND ART

A conventional solder composition (solder paste) used in a surface mounting technique is in the form of a paste which is obtained by dispersing, in a flux, solder powder as Sn-Pb alloy, and mixing necessary additives therein.

To mount an electronic device on a circuit board using a solder composition, the solder composition is put on a pad which serves as a mounting portion, and the device is placed on the board such that the terminal of the device is positioned on the solder composition. Then, the resultant structure is heated to melt the solder composition and electrically connect the device to the pad.

In the above structure, the device can be electrically connected to the pad in a reliable manner if they are sufficiently separated from each other. However, where they cannot sufficiently be separated in a high-density mounting, it is possible that portions of solder are connected to each other at the time of putting the solder composition on the pad or melting the same, thereby forming a solder bridge. When the solder bridge has been formed, short-circuiting will occur which degrades the circuit function. Moreover, repairing the solder bridge requires high cost.

As a solder-precipitating composition free from the above problem, U.S. Pat. No. 5,145,532 (Jpn. Pat. Appln. KOKAI Publication No. 1-157796) discloses a solder-precipitating composition which contains Sn powder and an organic acid salt of Pb.

This solder-precipitating composition has the following solder deposition mechanism:

1) The organic acid salt of Pb is separated into organic acid ions and Pb ions by heating;

2) Pb ions are displaced with nonionic Sn which has an ionization tendency higher than Pb, with the result that Pb ions are reduced to nonionic Pb and part of nonionic Sn is oxidized to Sn ions; and 3) The reduced Pb is dispersed into the other part of Sn (i.e. its nonionic portion), thereby forming a solder.

It was found that the above-described solder precipitation process shows behaviors which significantly differs from those shown in the case of melting solder at its melting point. For example, in the case of pre-coating pads of a printed circuit board with solder, using the conventional solder composition, adjacent portions of solder paste may be connected to each other after heating unless an appropriate amount of solder paste which is proportional to the area of the pad is supplied, thus forming a solder bridge. On the other hand, in the case of the solder-precipitating composition disclosed in U.S. Pat. No. 5,145,532, it is not necessary to supply the solder-precipitating composition by the printing method using a stencil corresponding to a pad pattern. This solder-precipitating composition is characterized in that even if the solder-precipitating composition is supplied on the overall surface of the board, solder is coated only on conductive pads, and no solder bridges are formed. This feature has now been highlighted under the circumstances that high-density circuit boards have been developed in accordance with downsizing of electronic parts. In such high-density circuit boards, it is extremely difficult to supply a solder composition by the printing method so as to avoid occurrence of solder bridges. In the solder-precipitating composition of U.S. Pat. No. 5,145,532, however, the above-described solder precipitation mechanism exerts on each Sn particle. It has been found that in Sn powder having a certain particle size distribution, the smaller the diameter of a particle and the higher the surface area ratio of the same, the higher the reaction speed (in other words, the larger the diameter, the lower the reaction speed). In light of this, the solder-precipitating composition of U.S. Pat. No. 5,145,532 inevitably shows variations in a final or target solder composition. This means that it is difficult to perform uniform pre-coating of solder. Sn powder of a uniform particle size may well cause uniform reaction. However, preparation of such Sn powder costs too much.

Moreover, in the case of obtaining an alloy consisting of 63 wt % Sn and 37 wt % Pb only by displacement reaction between Sn powder and Pb ions in the organic acid salt of Pb, the amounts of those portions of nonionic Sn and the organic acid salt of Pb, which are used only in ion exchange reaction and are not finally converted into a solder alloy, increase in the solder-precipitating composition. Accordingly, the amounts of effective components decrease in the solder-precipitating composition.

As aforementioned, in the conventional soldering method for soldering an electronic device, a solder composition is supplied on the pads of a printed circuit board by the printing method, and then the electronic device is mounted on the solder composition. Thereafter, the solder composition is made to reflow to solder the lead portions of the device. In addition to this soldering method, a method is put to practice, in which an electronic device is mounted after solder is pre-coated on the pads of a board and then a flux is supplied thereon, thereby heating the pre-coated solder to make it to reflow and fix the lead portions of the device. At the time of mounting an LSI electronic device such as QFP (Quad Flat Package), it is necessary to pre-coat solder such that the pre-coated solder layer has a thickness sufficient to absorb variations in lead coplanality between the leads of the component, in order to reliably fix the leads to the pads provided on the same surface of the board.

However, in the case of pre-coating the pads of a printed circuit board with a great amount of solder, using the solder-precipitating composition of U.S. Pat. No. 5,145,532, it is necessary to use a thick mask which makes printing control difficult, to supply the solder-precipitating composition on the board by the printing method as a general method. Furthermore, even if a great amount of solder-precipitating composition is supplied to form a thick solder layer on the board, the solder-precipitating composition inevitably melts and flows out during heating, with the result that the pads cannot be pre-coated with a great amount of solder. Therefore, it is necessary to repeatedly supply the solder-precipitating composition on the board and repeatedly subject it to substitution reaction.

DISCLOSURE OF INVENTION

The invention has been developed under the above-described circumstances, and aims to provide a solder-precipitating composition capable of pre-coating pads with a solder layer of a uniform and sufficient thickness in a short time, and capable of pre-coating the pads with solder without solder bridges even if the pads are arranged at narrow intervals.

The invention provides a solder-precipitating composition containing Sn-Pb alloy powder and an organic acid salt of Pb as essential components, and capable of precipitating solder as a result of ion exchange between Sn contained in the Sn-Pb alloy powder and Pb contained in the organic acid salt of Pb.

Further, the invention provides a mounting method comprising the steps of: supplying a conductor on a board with a solder-precipitating composition which contains Sn-Pb alloy powder and an organic acid salt of Pb as essential components; heating the solder-precipitating composition supplied on the conductor, to deposit solder on the conductive member and pre-coat the conductive member with solder, as a result of substitution reaction between Sn in the Sn-Pb alloy powder and Pb ions in the organic acid salt of Pb; mounting a device on the solder pre-coated conductor; and melting the solder layer to securely mount the device on the conductor.

BRIEF DESCRIPTION OF DRAWING

The drawing is a graph, showing the relationship between the heating time period and the Sn content of solder.

BEST MODE FOR CARRYING OUT INVENTION

A solder-precipitating composition according to the invention is characterized in that it contains Sn-Pb alloy powder and an organic acid salt of Pb.

In the solder-precipitating composition, ion exchange reaction between a device (Sn), which is contained in Sn-Pb alloy powder and has high ionization tendency, and Pb contained in the organic acid salt of Pb advances on the surfaces of the Sn-Pb alloy particles dispersed in the composition. In other words, part of Sn is ionized, while Pb ions in the organic acid salt of Pb are converted to nonionic Pb. The thus-obtained Pb encounters the Sn-Pb alloy, thereby forming an Sn-Pb alloy containing the encountered Pb. While Pb is alloyed in the Sn-Pb alloy, the alloy is shifted from an Sn-rich state to a Pb-rich state. Accordingly, the melting point of the Sn-Pb alloy is reduced, and a surface portion of the alloy starts to melt, thereby coating each pad with solder. On the surface of the pad, solder is deposited by means of an activator in the solder-precipitating composition.

Since the mechanism of the invention is based on atom-level alloying, uniform reaction occurs between the Sn-Pb alloy particles and the organic acid salt of Pb in the solder-precipitating composition. Therefore, the Sn-Pb alloy particles do not agglomerate into large particles, and solder is gradually deposited on the pads with the particle-dispersed state of the solder-precipitating composition unchanged. As a result, solder is coated without solder bridges. Since the invention has this mechanism, an appropriate solder layer is formed on each pad even if the pads are arranged at small intervals, and occurrence of a solder bridge is greatly restrained.

In the above-described mechanism, the speed of deposition of solder (alloying reaction) is determined on the basis of the number of occasions of atom-level collision of Sn and Pb. Since the solder-precipitating composition of the invention contains an alloy powder, the reaction time required until a final solder composition is obtained is shortened. In other words, since in the case of using the alloy powder, the precipitation of solder does not depend only upon the collision of a metal powder against a nonionic metal obtained as a result of substitution reaction, the amount of displaced metal obtained by ion exchange reaction can be reduced as compared with the case of using a single-metal powder. Since the amount of substituted metal obtained by substitution reaction can be reduced with the use of an alloy powder, the amount of metal contained in the solder-precipitating composition can be increased, which facilitates coating of a relatively-thick solder layer. In addition, variations in solder composition can be reduced since they substantially reflect variations in the composition of an alloy powder used.

Moreover, the use of an alloy powder can increase the metal ratio of the solder-precipitating composition, and also increase the amount of effective components for coating each pad of a circuit board with solder. On the other hand, in the case of the solder-precipitating composition disclosed in U.S. Pat. No. 5,145,532, in order to form an Sn-Pb eutectic structure only of nonionic Sn, a thick mask is necessary to supply a great amount of solder-precipitating composition by the printing method at the time of coating pads with solder. This is because the ratio of that portion of Sn powder and the organic acid salt of Pb, which is used only in substitution reaction, to the overall solder-precipitating composition is high; in other words, the solder-precipitating composition contains only a small amount of effective components for forming solder.

In this case, it is difficult to control the thickness of coating of the solder-precipitating composition, and the efficiency of cleaning performed in a later process is degraded. Further, even if a thick solder-precipitating composition layer is supplied on a circuit board, it flows out and becomes thinner during heating. Thus, the composition is not all pre-coated. In other words, the amount of solder pre-coated on a pad is limited. This being so, to pre-coat the pad with a thick solder layer, it is necessary to repeat the processes for supplying the solder-precipitating composition, subjecting the same to reaction and cleaning the resultant structure. Thus, the solder-precipitating composition of U.S. Pat. No. 5,145,532 has a very low coating efficiency.

In the case of using the solder-precipitating composition according to the invention, however, a relatively thin mask whose thickness is easy to control can be used since the composition has effective metal contents, and the cleaning can be performed in an easy manner in a later process. To pre-coat a thick solder layer, it suffices if each of the processes for supplying the solder-precipitating composition, subjecting the same to reaction and cleaning the resultant structure is performed only one time.

In the invention, to obtain a eutectic alloy of Sn-Pb (Sn/Pb=63/37) as the final solder composition, Sn-Pb alloy powder having an Sn ratio higher than 63/37 is used. Moreover, to obtain a Pb-rich solder composition as the final solder composition, Sn-Pb alloy powder having an Sn content higher than the final solder composition is used. To obtain a final solder composition having an Sn/Pb ratio of 10/90, Sn-Pb alloy powder having an Sn content higher than Sn/Pb=10/90 is used as the solder-precipitating composition. The above-described Sn-Pb alloys may contain a small amount of some other metal such as Ag or Cu.

It is preferable in the invention to set the diameter of each alloy particle to 1–20 µm. This is because if the diameter is less than 1 μm, the surface of alloy is oxidized and only a small amount of solder is precipitated. Further, if the diameter exceeds 20 μm, the range of variations in the precipitation amount of solder is wide.

It is preferable in the invention to set the amount of an alloy powder in the solder-precipitating composition to 10–90 wt %. This is because if the amount of the alloy powder is less than 10 wt %, a sufficient amount of solder cannot be precipitated. If the amount exceeds 90 wt %, it is difficult to keep the solder-precipitating composition in a paste state. Most preferably, the amount of the alloy powder is 20–70 wt %.

An organic acid constituting the organic acid salt of Pb consists, for example, of a rosin or its derivative; an aliphatic carboxylic acid such as stearic acid, oleic acid, neodecanoic acid, sebacic acid, fumaric acid, etc.; an aromatic carboxylic acid such as benzoic acid, phthalic acid, isophthalic acid, trimellitic acid, pyromellitic acid, etc.; or naphthenic acid, etc. Further, a polybasic acid such as a dibasic acid, a thribasic acid or the like may be used.

In particular, it is preferable to use, as the organic acid, a rosin or its derivative, or naphthenic acid. As the rosin, gum rosin, tall oil rosin, wood rosin, etc. is used. Each of pure substances such as abletic acid, pimaric acid, etc., which are main components of rosin, may be used in place of the rosin. As the derivative of the rosin, disproportionated rosin, hydroten-added rosin, maleic or fumaric rosin, etc. may be used. The kind of the organic acid salt of Pb is selected in accordance with solder pre-coating conditions (temperature, atmosphere, etc.).

In the solder-precipitating composition of the invention, Ag or Cu may be contained as a third component in addition to Sn and Pb by adding a small amount of an organic acid salt of Ag or an organic acid salt of Cu.

It is preferable to set the content of the organic acid salt of Pb in the solder-precipitating composition to 3–60 wt % (in the case of Pb naphthenic containing 20 wt % Pb, for example, the content of Pb is 0.6–12 wt %). This is because if the content of the organic acid salt of Pb is less than 3 wt %, the boundary tension of a precipitated solder is low and hence a solder bridge is liable to occur. On the other hand, if the content exceeds 60 wt %, the paste state of the solder-precipitating composition is unstable and hence cannot be put on pads with accuracy at the time of pre-coating solder. The most preferable content of the organic acid salt of Pb is 7.5–50 wt % (in the case of Pb naphthenate containing 20 wt % Pb, for example, the content of Pb is 1.5–10 wt %).

It is preferable to set the Pb content of the organic acid salt of Pb to 1.5 wt % or more of the solder-precipitating composition. This is because if the Pb content is less than 1.5 wt % of the solder-precipitating composition, the effect of Pb for restraining the occurrence of a solder bridge at the time of solder pre-coating is reduced. Moreover, it is preferable to set the Pb content of the organic acid salt of Pb to 12 wt % or less of the solder-precipitating composition, since a variation may well occur in solder composition where too much Pb is contained.

The Pb content of the solder-precipitating composition, which can effectively restrain the occurrence of a solder bridge, depends upon the composition of an alloy powder or the kind of an organic acid salt of Pb. Further, adjusting the Pb content of an organic acid salt of Pb enables appropriate pre-coating of solder on a fine pattern. Since a too-low Pb content of an organic acid salt of Pb inevitably reduces the pattern-following ability of the solder-precipitating composition, it is necessary to set the Pb content to an allowable value.

In the invention, the ratio between Sn and Pb (the sum of Pb contained in an alloy powder and an organic acid salt of Pb) is determined in accordance with a solder composition suitable to use. To obtain a eutectic solder composition, the ratio of Sn to Pb is set to 63/37.

If necessary, the solder-precipitating composition of the invention may be in the form of a paste in which the following agents are added: an adhesive such as gum rosin, etc.; an activator such as diethanolamine, triethanolamine, etc.; a solvent such as butylcarbitol, mineral spirit, etc.; and a viscosity-holding agent such as castor wax, cellulose powder, etc. In the case of adding these additives in the solder-precipitating composition, they may be directly mixed with an alloy powder and an organic acid salt of Pb. Alternatively, a flux may be beforehand prepared by mixing the adhesive, the activator and the solvent, and then mixed with the alloy powder and the organic acid salt of Pb.

To deposit solder using the solder-precipitating composition of the invention, it is necessary to set the heating temperature for solder precipitation reaction to a value higher than the solidus line of the solder. This is because setting the heating temperature to a value lower than the solidus line at the time of solder precipitation causes solid phase/solid phase diffusion of Pb precipitated from the organic acid salt of Pb and the alloy powder in the solder-precipitating composition. As a result, reaction advances at extremely low speed and a great amount of time is required to obtain a final solder composition. On the other hand, if the heating temperature is set higher than the solidus line, reaction advances at high speed and the final solder composition can be obtained in a short time. Specifically, it is preferable to set the heating temperature to 210°–220° C.

To mount an electronic device on a pad of a printed circuit board with the use of the solder-precipitating composition of the invention, firstly, the solder-precipitating composition, which contains Sn-Pb alloy powder and an organic acid salt of Pb as essential components, is supplied on the pad, and then heated to deposit solder as a result of substitution reaction between nonionic Sn in the Sn-Pb alloy powder and Pb ions in the organic acid salt of Pb. Thereafter, the electronic device is placed on the pre-coated solder, and fixed to the pad by melting the solder. To melt the solder pre-coating, the precipitated solder is heated to a temperature higher than its melting point.

Examples of the solder-precipitating composition of the invention will now be explained in detail.

EXAMPLE 1

First, a flux A in the form of paste was prepared by mixing 60 wt % gum rosin as an adhesive, 10 wt % diethanolamine as an activator, 10 wt % castor wax, and 20 wt % butylcarbitol as a solvent.

Subsequently, a solder-precipitating composition according to the invention was prepared by mixing 40 wt % solder powder (Sn/Pb=70/30) of an average particle size of 10 μm, 20 wt % Pb naphthenate containing 24 wt % Pb, as the organic acid salt of Pb, and 40 wt % flux A.

EXAMPLE 2, COMPARATIVE EXAMPLE 1

An example 2 and a comparative example 1 were prepared in a manner similar to the example 1, except for that they contain an alloy powder, Sn powder and Pb naphthenate which have compositions as shown in table 1, respectively.

TABLE 1

| COMPO-SITION | SOLDER POWDER | Sn POWDER | Pb NAPH-THENATE | FLUX A |
|---|---|---|---|---|
| EXAMPLE 1 | 40 *1 | | 20 | 40 |
| EXAMPLE 2 | 60 *1 | | 20 | 20 |
| COMPARATIVE EXAMPLE 1 | | 25 | 45 | 30 |

(UNIT: wt %)
*1 Sn/Pb = 70/30
*2 Sn/Pb = 25/75

Each of the solder-precipitating compositions of the examples 1 and 2 and the comparative example 1 was coated on a 160-pin QFP pattern (the pitch of the pins is 0.3 mm) formed on a printed circuit board, such that the layers of the compositions had a thickness of 250 μm. The resultant structures were placed on a heating plate of 250° C. for 120 seconds, thereby precipitating solders. The QFP pattern was formed of Ni plated with Au by flushing. The resultant board was cleaned by means of toluene, and then the solders were dissolved by an acid into liquid samples, which were subjected to atomic absorption analysis. Table 2 shows the results of the analysis.

TABLE 2

| COMPOSITION | THEORETICAL COMPOSITION | ANALYSIS RESULTS |
|---|---|---|
| EXAMPLE 1 | Sn/Pb = 60/40 | Sn/Pb = 62/38 |
| EXAMPLE 2 | Sn/Pb = 20/80 | Sn/Pb = 22/78 |
| COMPARATIVE EXAMPLE 1 | Sn/Pb = 63/37 | Sn/Pb = 66/34 |

As is evident from table 2, solders having compositions close to a theoretical composition are obtained from the examples 1 and 2 and the comparative example 1 as a result of a heating treatment at 250° C. This means that ion exchange reaction (substitution reaction) in the solder-precipitating compositions, which is the mechanism of the invention, occurred. In table 2, the theoretical composition indicates a target composition for precipitating solder.

Further, with respect to the solder-precipitating compositions of the examples 1 and 2 and the comparative example 1, variations in solder composition between pre-coated solder layers were examined. Specifically, solder layers are coated on 20 QFP patterns with the use of each of the above-described solder-precipitating compositions. Then, 20 liquid samples obtained from the 20 solder layers per each solder-precipitating composition were subjected to atomic absorption analysis to measure their Sn contents. The variations were obtained by calculating the difference between the maximum value and the minimum value of the Sn contents measured per each solder-precipitating composition. The calculation results are shown in table 3. Moreover, the number of bridges in the 160 pins of each solder layer coated on the QFP pattern was counted by the eyes. The counted results are also shown in table 3.

Thereafter, the time (treatment time) required until each solder was precipitated was measured, with respect to the solder-precipitating compositions of the examples 1 and 2 and the comparative example 1. Specifically, four solder-precipitating composition layers of each composition were formed on four QFP patterns, and were heated for 30, 60, 90 and 120 seconds, respectively. Liquid samples obtained from the resultant solder layers were subjected to atomic absorption analysis to measure their Sn contents. The time required until the Sn content of each liquid sample reached 90% or more of the Sn content of a target solder composition was deemed as the required treatment time of the liquid sample. The measured required time periods are also shown in table 3.

Subsequently, the thickness of each solder layer was measured, with respect to the solder-precipitating compositions of the examples 1 and 2 and the comparative example 1. Specifically, a 200 μm-thick solder-precipitating composition layer of each composition was formed on each QFP pattern, and was heated at 250° C. for 120 seconds to form a solder layer. The thickness of each solder layer was measured by a surface-roughness meter. The measured thicknesses are shown in table 3.

TABLE 3

| | DISPRESIONS IN SOLDER COMPOSITION *3 | REQUIRED SOLDER PRECIPITATING TIME PERIOD *4 | SOLDER LAYER THICKNESS (μm) | NUMBER OF SOLDER BRIDGES *5 |
|---|---|---|---|---|
| EXAMPLE 1 | 2.2 | 60 | 37 | 0 |
| EXAMPLE 2 | 1.1 | 60 | 40 | 0 |
| COMPARATIVE EXAMPLE 1 | 8.2 | 120 | 24 | 0 |

*3: Difference between the maximum value and the minimum value of the Sn contents of 20 liquid samples
*4: Time (seconds) required until the Sn content of each liquid sample reaches 90% or more of the Sn content of a target solder composition
*5: The number of bridges in the QFP 160 pins As is evident from table 3, with respect to the solder-precipitating compositions of the examples 1 and 2, the range of variations in solder composition between pre-coated solder layers is narrow, the time required until each solder is precipitated is relatively short, thick solder layers can be formed, and the number of solder bridges found in each pre-coated solder layer is small. On the other hand, with respect to the solder-precipitating composition of the comparative example 1, the range of variations in solder composition between pre-coated solder layers is wide, the time required until each solder layer is precipitated is relatively long, and thick solder layers cannot be formed, although the number of solder bridges found in each pre-coated solder layer is small.

EXAMPLES 3–5, COMPARATIVE EXAMPLE 2

To more clarify the advantage of the invention, further examinations were carried out as regards variations in solder composition between pre-coated solder layers, the time required until each solder was precipitated, and the thickness of each pre-coated solder layer.

First, each of the solder-precipitating compositions of examples 3–5 and a comparative example 2 was prepared by mixing a corresponding alloy powder or Sn powder, a corresponding organic acid salt of Pb and a corresponding flux A (as used in the case of the example 1), which have compositions as shown in table 4.

TABLE 4

|  | EXAMPLE 3 | EXAMPLE 4 | EXAMPLE 5 | COMPARATIVE EXAMPLE 2 |
|---|---|---|---|---|
| SOLDER POWDER | 35 *6 | 41 *7 | 60 *8 |  |
| Sn POWDER |  |  |  | 25 |
| ORGANIC ACID SALT OF Pb (Pb 24%) | 40 | 30 | 20 | 45 |
| FLUX A | 25 | 29 | 20 | 30 |

*6: Sn/Pb = 90/10
*7: Sn/Pb = 80/20
*8: Sn/Pb = 70/30

With respect to the solder-precipitating compositions of the examples 3–5 and the comparative example 2, variations in solder composition between pre-coated solder layers, the time required until each solder layer was precipitated, and the thickness of each solder layer were examined. The variations in solder composition, the time required until each solder layer was precipitated, and the thickness of each solder layer are shown in table 5, the attached figure, and table 6, respectively. The variations were examined in a manner similar to the examples 1 and 2. The required time was measured by subjecting the Sn content to atomic absorption analysis after 30-second heating, 60-second heating, 90-second heating and 120-second heating, respectively. As regards the thickness, the thicknesses of solder layers obtained from solder-precipitating composition layers having thicknesses of 200 µm, 300 µm, 400 µm and 500 µm and formed on 80-pin QFP patterns (the pitch of the pins is 0.8 mm), respectively, were measured. The estimation of the other points was performed in a manner similar to the case of the examples 1 and 2.

TABLE 5

| Sn CONTENT |  | EXAMPLE 3 | EXAMPLE 4 | EXAMPLE 5 | COMPARATIVE EXAMPLE 2 |
|---|---|---|---|---|---|
| Sn CONTENT | MINIMUM VALUE | 61.9 | 61.8 | 61.8 | 62.0 |
|  | MAXIMUM VALUE | 67.1 | 65.3 | 64.2 | 70.2 |
|  | DIFFERENCE | 5.2 | 3.5 | 2.4 | 8.2 |

Target Composition is 63.0% (UNIT: wt %)

TABLE 6

| THICKNESS OF SOLDER-PRECIPITATING COMPOSITION | EXAMPLE 3 | EXAMPLE 4 | EXAMPLE 5 | COMPARATIVE EXAMPLE 2 |
|---|---|---|---|---|
| 200 | 33 | 45 | 75 | 20 |
| 300 | 45 | 61 | 97 | 25 |
| 400 | 58 | 79 | 125 | 28 |
| 500 | 70 | 93 | 150 | 32 |

(UNIT: µm, Average Value)

As is evident from table 5, the range of variations in solder composition is narrow between the solder-precipitating compositions according to the examples 3–5 of the invention, which contain respective alloy powders. In particular, it should be noted that the nearer composition to a target composition the solder powder of the solder-precipitating composition layer has, the narrower the range of the variations is. On the other hand, variations in solder composition is wide between the solder-precipitating compositions according to the comparative example 2, which contain a single metal powder. Further, as is evident from the figure, each of the solder-precipitating compositions according to the invention, which contain respective alloy powders, reaches the target composition after a short heating time. In particular, the nearer composition to the target composition the solder powder of the solder-precipitating composition layer has, the shorter the required time. On the other hand, the solder-precipitating composition which contain the single metal powder requires a long time to reach the target composition.

Moreover, as is evident from table 6, the solder-precipitating compositions according to the invention, which contain alloy powders, can have thick solder layers. In particular, it should be noted that the nearer composition to the target composition the solder powder of the solder-precipitating composition layer has, the thicker the solder layer is. On the other hand, the solder-precipitating composition which contain the single metal powder can have only a thin solder layer. Further, table 6 indicates that the thicker the solder-precipitating composition layer of the invention, the thicker the solder layer, and indicates that the solder-precipitating composition which contain the single metal powder cannot have a thick solder layer even if the solder-precipitating composition layer is thick. This means that there is a limit in the thickness of a solder layer formed from the solder-precipitating composition which contain the single metal powder.

The above-described advantage results from the feature of the invention that the content of a substituted metal obtained by substitution reaction can be reduced in a solder-precipitating composition which contains an alloy powder, and that the content of effective metal components can be increased in the solder-precipitating composition.

EXAMPLE 6

To define an optimal range of the Pb content of the solder-precipitating composition of the invention, the following experiments were carried out:

First, a solder-precipitating composition according to the invention was prepared by mixing 40.0 wt % solder powder (Sn/Pb=65/35) of an average particle size of 10 µm, 7.5 wt % Pb naphthenate as an organic acid salt of Pb, a 25.0 wt % rosin as an adhesive, 8.5 wt % triethanolamine as an activator, and 19.5 wt % mineral spirit as a solvent.

EXAMPLES 7 AND 8, COMPARATIVE EXAMPLES 3 AND 4

Solder-depositing compositions of examples 7 and 8 and comparative examples 3 and 4 were prepared in a manner similar to the case of the example 6 except that they contain different amounts of Pb naphthenate as shown in table 7.

EXAMPLE 9

A solder-precipitating composition of an example 9 was prepared in a manner similar to the case of the example 6, except that the content of the solder powder (Sn/Pb=65/35)

is 20.0 wt % and the content of Pb naphthenate is 20.0 wt % as shown in table 1.

The layers of the solder-precipitating compositions of the examples 6–9 and the comparative examples 3 and 4 were formed, by screen printing, on circuit boards having 160-pin QFP patterns (the pitch of the pins is 0.3 mm), respectively, such that they have a thickness of 300 μm, and were heated at 220° C. to deposit solder. These boards were cleaned by toluene and dried, thereby forming solder layers on the QFP patterns of the boards.

Subsequently, solder bridges on the QFP patterns of the solder layers formed using the above-described solder-precipitating compositions were observed by the eyes. The number of the solder bridges are also shown in table 7.

Further, the observation results are shown in table 8.

TABLE 7

|  | CONTENT OF Pb NAPHTHENATE (5) (Pb24%) | CONTENT OF Pb (%) | NUMBER OF BRIDGES *9 |
| --- | --- | --- | --- |
| EXAMPLE 6 | 7.5 | 1.5 | 2–12 |
| EXAMPLE 7 | 10.0 | 2.0 | 0–1 |
| EXAMPLE 8 | 25.0 | 5.0 | 0 |
| EXAMPLE 9 | 50.0 | 10.0 | 0 |
| COMPARATIVE EXAMPLE 3 | 0 | 0 | 13–18 |
| COMPARATIVE EXAMPLE 4 | 5.0 | 1.0 | 17–20 |

*9 Number of Bridges in 160-PIN QFP

TABLE 8

| EXAMPLE 6 | The aggregation of the alloy powder was restrained and a small of solder bridges were found. |
| --- | --- |
| EXAMPLE 7 | The aggregation of the alloy powder was significantly restrained and almost no solder bridges were found. |
| EXAMPLE 8 | The aggregation of the alloy powder was restrained and no solder bridges were found. |
| EXAMPLE 9 | The aggregation of the alloy powder was restrained and no solder bridges were found. |
| COMPARATIVE EXAMPLE 3 | A metal powder in the remainder was all aggregated on pads, and triple bridges, etc. were found in many places. |
| COMPARATIVE EXAMPLE 4 | A metal powder in the remainder was all aggregated on pads, and triple bridges, etc. were found in many places. |

As is evident from tables 7 and 8, where Pb naphthenate is used as an organic acid salt of Pb, occurrence of solder bridges can be prevented at the time of pre-coating a fine pattern with solder if the Pb content of the solder-precipitating composition is 1.5 wt % or more. Thus, in accordance with the composition of an alloy powder and the kind of an organic acid salt of Pb, the Pb content has a range which enables occurrence of solder bridges, which may occur at the time of pre-coating a fine pattern with solder, to be effectively prevented.

Thereafter, with respect to the solder-precipitating compositions of the examples 6–9, examinations were carried out as regards variations in solder composition between pre-coated solder layers, the time (treatment time) required until each solder was precipitated, and the thickness of each pre-coated solder layer. As a result, it was found that solder-precipitating compositions according to each of the examples 6–9 show a narrow range of variations in solder composition, require a short time until each solder layer is precipitated, and provide thick solder layers.

EXAMPLES 10 AND 11

Solder-precipitating compositions of examples 10 and 11 were prepared in a manner similar to the example 6, except that Pb stearinate and Pb acetate were used instead of Pb naphthenate in the examples 10 and 11, respectively. The contents of Pb stearinate and Pb acetate were adjusted such that the Pb content of each solder-precipitating composition was 2.0 wt %.

Each of the solder-precipitating compositions of the examples 10 and 11 was formed, by screen printing, on a 160-pin QFP pattern (the pitch of the pins is 0.3 mm) such that the it forms a layer of 300 μm. The solder-precipitating composition layer is heated at 220° C. to deposit solder. The resultant structure is cleaned using toluene and dried, thereby forming a solder layer.

Subsequently, with respect to solder layers formed on boards, using each solder-precipitating composition, examinations were carried out as regards variations in solder composition between pre-coated solder layers, the time (treatment time) required until each solder was precipitated, and the thickness of each pre-coated solder layer. As a result, it was found that solder-precipitating compositions according to each of the examples 10 and 11 show a narrow range of variations in solder composition, require a short time until each solder layer is precipitated, and provide thick solder layers each having no solder bridges.

Since as explained above, a solder-precipitating composition according to the invention contains Sn-Pb alloy powder and an organic acid salt of Pb as essential components, it can provide, on a pad in a short time, a solder layer with a uniform and sufficient thickness, and cap perform pre-coating of solder without forming a solder bridge even if pads are arranged at narrow intervals.

We claim:

1. A solder-precipitating composition containing Sn-Pb alloy powder and an organic acid salt of Pb as essential components, and capable of precipitating solder as a result of substitution reaction between Sn contained in the Sn-Pb alloy powder and Pb ions contained in the organic acid salt of Pb.

2. The solder-precipitating composition according to claim 1, further containing a solvent and a viscosity-holding agent.

3. The solder-precipitating composition according to claim 1, wherein the content of the Sn-Pb alloy powder is 20–70 wt %, and the content of the organic acid salt of Pb is 7.5–50 wt %.

4. The solder-precipitating composition according to claim 1, wherein the precipitated solder has a eutectic structure of Sn and Pb, the Sn-Pb alloy powder contains 65–90 wt % Sn, and the content of the Sn-Pb alloy powder is 20–70 wt % of the solder-precipitating composition.

5. The solder-precipitating composition according to claim 1, wherein the Sn-Pb alloy powder has a particle size of 1–20 μm.

6. A solder-precipitating method comprising the steps of:

supplying a solder-precipitating composition which contains Sn-Pb alloy powder and an organic acid salt of Pb as essential components; and heating the solder-precipitating composition to precipitate solder as a result of substitution reaction between Sn in the Sn-Pb alloy powder and Pb ions in the organic acid salt of Pb.

7. The method according to claim 6, wherein the heating temperature is 210°–220° C.

8. A mounting method comprising the steps of:

supplying a conductor on a board with a solder-precipitating composition which contains Sn-Pb alloy powder and an organic acid salt of Pb as essential components;

heating the solder-precipitating composition supplied on the conductor, to precipitate solder on the conductor and pre-coat the conductor with solder, as a result of ion substitution reaction between Sn in the Sn-Pb alloy powder and Pb ions in the organic acid salt of Pb;

mounting a device on the solder pre-coated conductor; and melting the solder layer to securely mount the device on the conductor.

9. The method according to claim 8, wherein the heating temperature for precipitating solder is 210°–220° C.

* * * * *